United States Patent
Kubo et al.

(10) Patent No.: US 12,288,957 B2
(45) Date of Patent: *Apr. 29, 2025

(54) ULTRA-LOW NOISE CRYOGENIC MICROWAVE AMPLIFICATION

(71) Applicant: Okinawa Institute of Science and Technology School Corporation, Onna-son Okinawa (JP)

(72) Inventors: Yuimaru Kubo, Onna-son Okinawa (JP); Jason Robert Ball, Onna-son Okinawa (JP); Petr Moroshkin, Onna-son Okinawa (JP); Denis Konstantinov, Onna-son Okinawa (JP)

(73) Assignee: Okinawa Institute of Science and Technology School Corporation, Okinawa (JP)

(*) Notice: Subject to any disclaimer, the term of this patent is extended or adjusted under 35 U.S.C. 154(b) by 23 days.

This patent is subject to a terminal disclaimer.

(21) Appl. No.: 18/208,531

(22) Filed: Jun. 12, 2023

(65) Prior Publication Data

US 2023/0327388 A1 Oct. 12, 2023

Related U.S. Application Data

(63) Continuation of application No. 16/806,874, filed on Mar. 2, 2020, now Pat. No. 11,677,206.

(Continued)

(51) Int. Cl.
   *H01S 1/02* (2006.01)
(52) U.S. Cl.
   CPC ...................... *H01S 1/02* (2013.01)
(58) Field of Classification Search
   CPC ............ H01S 1/02; G01N 24/10; H03F 21/00
   See application file for complete search history.

(56) References Cited

U.S. PATENT DOCUMENTS

| 3,210,674 A | 10/1965 | Hughes |
| 11,677,206 B2 * | 6/2023 | Kubo ................. H03F 3/19 330/4 |

(Continued)

FOREIGN PATENT DOCUMENTS

| EP | 0503624 A1 | 9/1992 |
| JP | 39-002805 | 3/1964 |

(Continued)

OTHER PUBLICATIONS

Kubo, U.S. Appl. No. 16/806,874, filed Mar. 2, 2020, Notice of Allowance and Fees Due, Jan. 19, 2023.

(Continued)

*Primary Examiner* — Ryan Johnson
(74) *Attorney, Agent, or Firm* — HICKMAN BECKER BINGHAM LEDESMA LLP

(57) ABSTRACT

Embodiments of the microwave amplification system are described. In an embodiment, a microwave amplification system includes a microwave amplifier that contains a paramagnetic material with an impurity. The impurity has a plurality of nuclear spin and electron spin-based energy levels. The system includes an input to receive a pumping signal which is transmitted to the microwave amplifier to cause a population inversion in the impurity and excite it to one of the nuclear spin and electron spin-based energy levels. The system further includes another input to receive an input signal to be amplified by the microwave amplifier, the input signal having a lower power than the pumping signal. Once transmitted to the microwave amplifier, the input signal is amplified by the excited state of the impurity in the microwave amplifier thereby generating an amplified signal.

20 Claims, 14 Drawing Sheets

Related U.S. Application Data

(60) Provisional application No. 62/813,537, filed on Mar. 4, 2019.

(56) References Cited

U.S. PATENT DOCUMENTS

| | | |
|---|---|---|
| 2017/0077665 A1 | 3/2017 | Liu et al. |
| 2020/0287343 A1 | 9/2020 | Kubo |

FOREIGN PATENT DOCUMENTS

| | | |
|---|---|---|
| JP | 40-019658 | 9/1965 |
| JP | 44-018593 | 8/1969 |
| JP | 47-031426 | 9/1972 |
| JP | 04-284681 | 10/1992 |

OTHER PUBLICATIONS

Kubo, U.S. Appl. No. 16/806,874, filed Mar. 2, 2020, Non-Final Rejection, Jul. 25, 2022.
Kubo, U.S. Appl. No. 16/806,874, filed Mar. 2, 2020, Final Rejection, Oct. 31, 2022.
Kubo, U.S. Appl. No. 16/806,874, filed Mar. 2, 2020, Non-Final Rejection, Apr. 8, 2022.
Walsworth Jr. et al., "Hydrogen maser at temperatures below 1 K", Physical Review A, vol. 34, No. 3, Sep. 1986, 4 pages.
Jin et al., "Proposal for a room-temperature diamond maser", Nature Communications, Sep. 23, 2015, 8 pages.
"Notice of Reasons for Refusal", JP Patent Appl. No. 2020-035699; issued on Sep. 25, 2023, 10 pages.
"Decision to Grant a Patent", JP Appl. No. JP2020-035699, issued on May 13, 2024, 3 pages.

\* cited by examiner

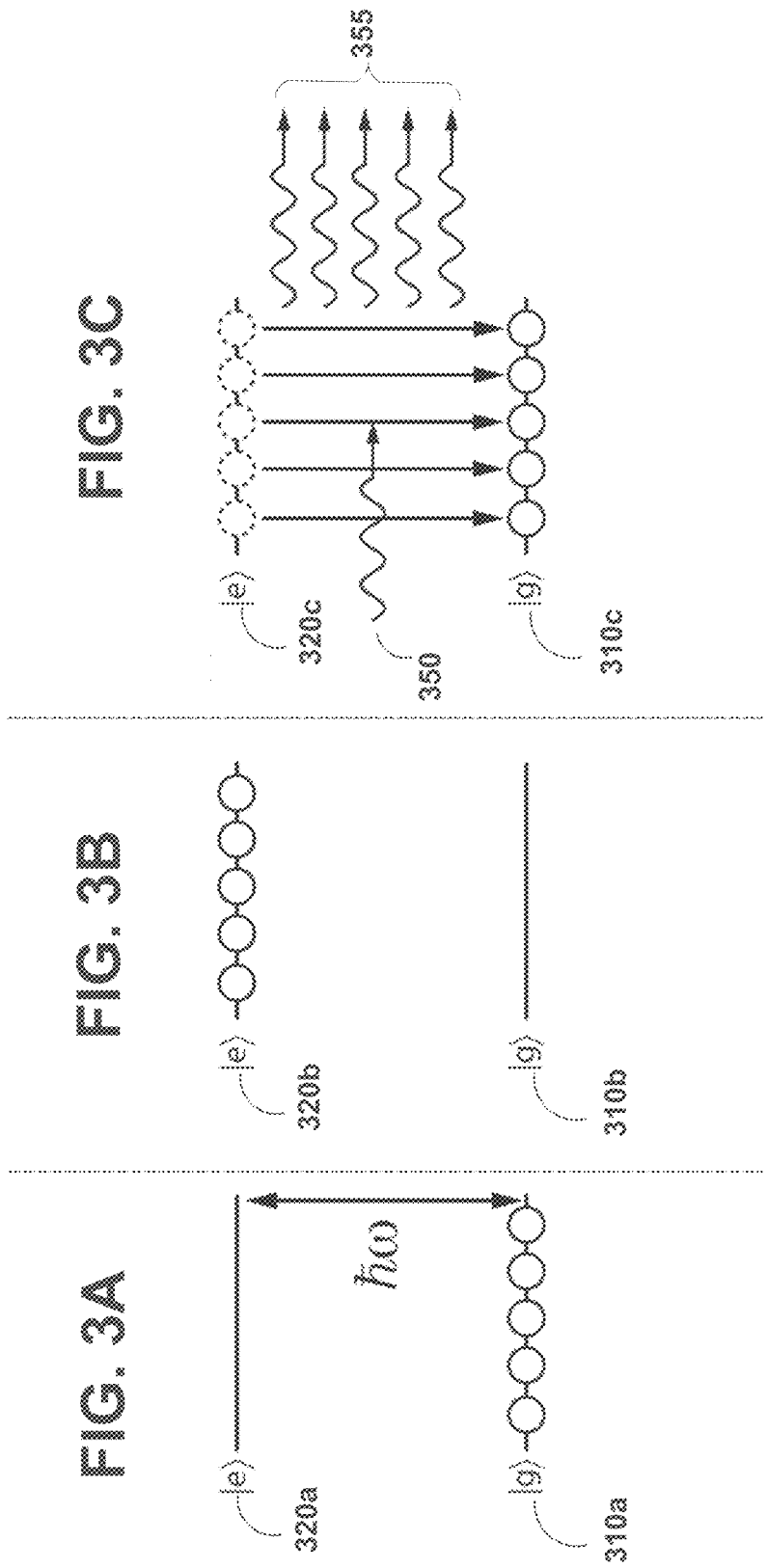

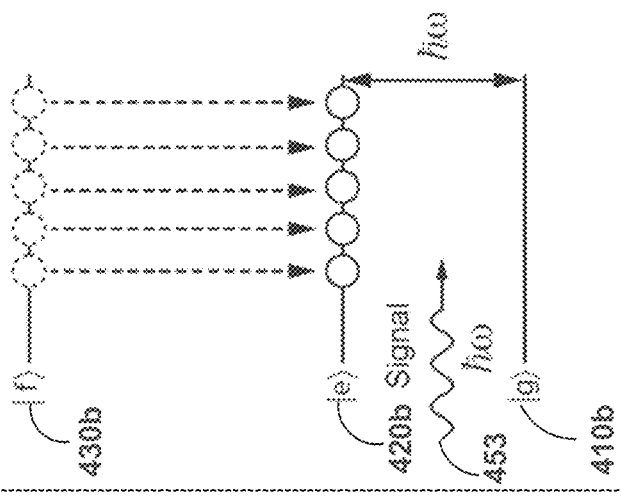
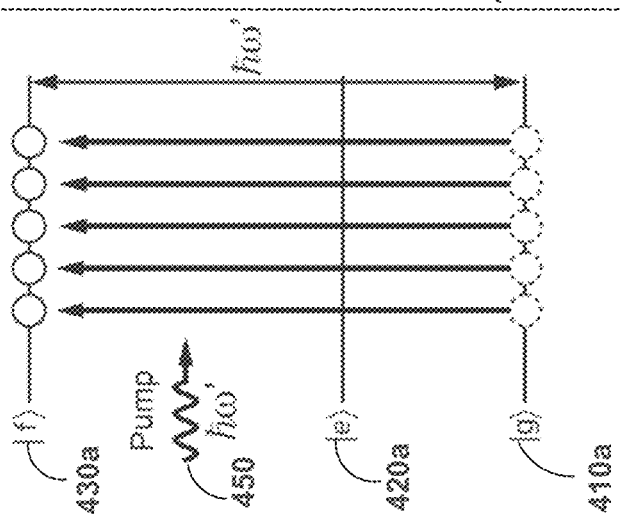

FIG. 10 Quantum System for Microwave Amplification 1000

ULTRA-LOW NOISE CRYOGENIC MICROWAVE AMPLIFICATION

BENEFIT CLAIM

This application claims the benefit as a continuation of application Ser. No. 16/806,874 filed Mar. 2, 2020, by Yuimaru Kubo et al., the entire contents of which is hereby incorporated by reference, which claims the benefit under 35 U.S.C. § 119(e) of provisional application 62/813,537, filed Mar. 4, 2019, the entire contents of which is hereby incorporated by reference for all purposes as if fully set forth herein.

FIELD OF THE TECHNOLOGY

The present invention relates to the field of electronic signal amplification, in particular to ultra-low noise cryogenic microwave amplification.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Quantum-level signals at microwave frequencies require ultra-low temperature operations. For example, the required temperature may vary from 10 to 100 millikelvin, because the energy of thermal noise $k_B T$ of the environment has to be much lower than the energy of a single quanta $\hbar \omega$ at a microwave frequency (microwave photon), where $k_B$ is Boltzmann's constant (=1.38×10$^{-23}$ J/K=1.38×10$^{-23}$ m²kgs$^{-2}$ K$^{-1}$), $\hbar$ the reduced Planck's constant (1.05×10$^{-34}$ m² kg s$^{-1}$). Accordingly, for the 5 GHz microwave, the corresponding temperature is, $$\frac{\hbar \omega}{k_B} \approx 250 \ mK.$$

Because of the low energy of microwave signals at the quantum level, amplification of microwave signals, especially low-noise amplification, at millikelvin environments is extremely challenging. However, such amplification is very important, if not necessary, for quantum computing technology and its applications.

BRIEF DESCRIPTION OF THE DRAWINGS

In the drawings of certain embodiments in which like reference numerals refer to corresponding parts throughout the figures:

FIG. 3A, FIG. 3B and FIG. 3C are diagrams that describe an example of a maser operation, in one or more embodiments;

FIG. 4A and FIG. 4B are diagrams that depict an example operation of three-level maser with a pump signal, in one or more embodiments;

DETAILED DESCRIPTION

In the following description, for the purposes of explanation, numerous specific details are set forth in order to provide a thorough understanding of the various embodiments. It will be apparent, however, that embodiments may be practiced without these specific details. In other instances, structures and devices are depicted in block diagram form in order to avoid unnecessarily obscuring the embodiments.

General Overview

Quantum technology-based techniques for amplifying microwave signals at millikelvin environments are described. The signals may include quantum-based information (qubit) carrying signal, magnetic resonance, or any other signal at microwave frequencies. Using the approaches described herein microwave signals are amplified with a higher dynamic range than the prior art and without any other noise besides the low noise due to a quantum mechanical fluctuation.

The amplification of microwave signal is generated based on impurity spins in a solid crystal, which is placed in a microwave resonator or embedded in a waveguide. The approaches maintain the advantages of Josephson parametric amplifiers (JPA) for quantum technology and applications but with a much higher dynamic range. In addition, the proposed amplification techniques functions under magnetic field, which JPA also lacks. Any quantum device, which works at microwave frequencies in a refrigerator and operates with superconducting or semiconducting quantum bits, quantum dots, mechanical resonators, or spins, may use these techniques.

Quantum Signal Noise Overview

In an embodiment, the signal-to-noise ratio of a system, and thus its performance, is determined by the noise added by the first amplifier. Such noise may be characterized by the noise power spectral density $S(\omega)$ at the signal frequency $\omega$. As a figure-of-merit for amplifiers, this noise level is often expressed in the dimension of temperature $$T_N\left[=\frac{S(\omega)}{k_B}\right],$$

referred to as a noise temperature. Accordingly, the noise may depend on the temperature of the environment.

The number of noise photons added by the amplifier having a noise temperature $T_N$ is expressed by $$n=\left(e^{\frac{\hbar\omega}{k_B T_N}}-1\right)^{-1}.$$

For example, one of the low-noise cryogenic microwave amplifiers is a high electron mobility transistor (HEMT) amplifier, whose typical noise temperature is about 3-5 K, i.e., adding more than 10 noise photons. The lower limit of $T_N$ is given by zero-point energy fluctuation $\hbar\omega/2$ because of the quantum mechanical uncertainty.

Therefore, in order to maximize the signal-to-noise ratio of the microwave measurement for a quantum DUT, the first amplifier should have a noise temperature as close as possible to the zero-point energy fluctuation, i.e., $$T_{N0}=\frac{\hbar\omega}{2k_B}.$$

Figure 1A:
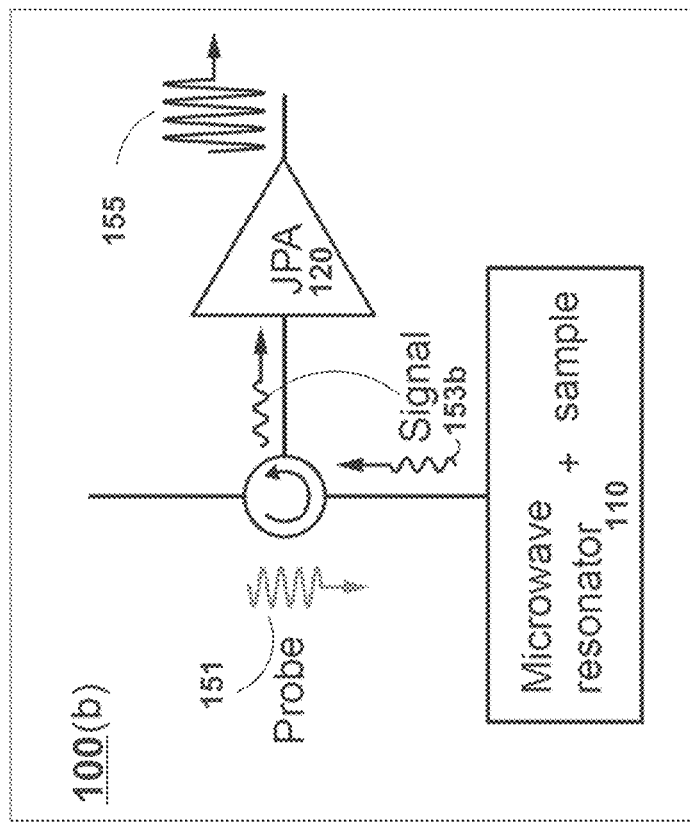
FIG. 1A is a block diagram that depicts an example quantum microwave amplification system for a "quantum DUT" (device-under-test) in a transmission measurement.

FIGS. 1(a)/(b) are block diagrams that depict a system with a Josephson parametric amplifier (JPA) operating at millikelvin temperature, in one or more embodiments. Josephson parametric amplifiers (JPA) 120 is based on superconducting circuits in which Josephson junctions (superconducting tunnel junctions) are embedded. Such amplifiers exploit the nonlinearity of Josephson junctions, and are operated at temperatures much lower than the energy of the microwave signals, i.e., $$T\ll\frac{\hbar\omega}{k_B},$$

in the millikelvin temperature range. JPAs have better performance as the amplifier typically add n=0.5 to 1 noise photons. The systems 100(a)/(b) may further include microwave resonator 110 which contains sample(s) at millikelvin, inside a dilution refrigerator.

Figure 1B:
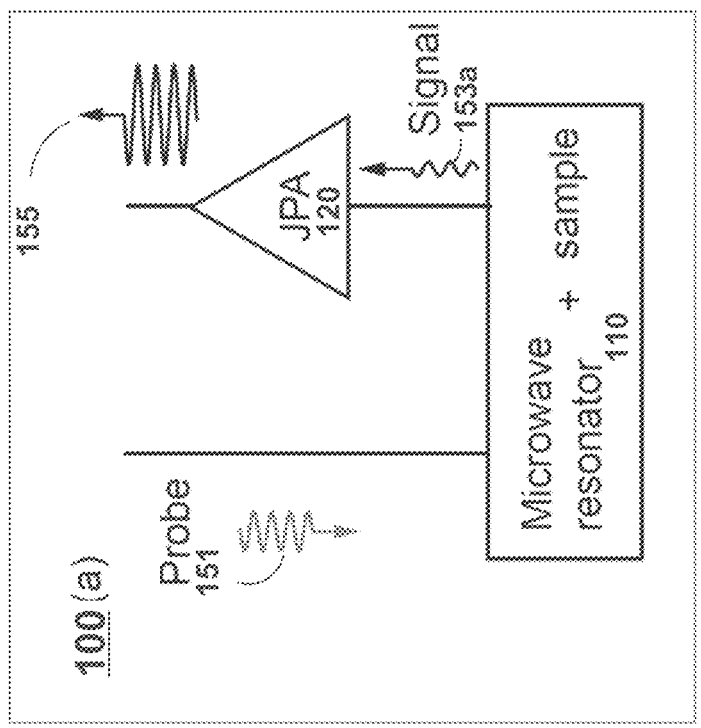
FIG. 1B is a block diagram that depicts an example quantum microwave amplification system for reflection measurement, in one or more embodiments.

FIG. 1(a) is a block diagram that depicts an example quantum system for transmission measurement, in an embodiment, and FIG. 1(b) is a block diagram that depicts an example quantum system for reflection measurement, in an embodiment. Probe microwave signal 151 is sent to quantum DUT 110, and either transmitted signal 153a in system 100(a) or reflected signal 153b in system 100(b) is routed to JPA 120, which amplifies the signal (signal 155).

As depicted in FIG. 1(b), JPA 120 may function in reflection too. In either case, amplified signal 155 is still small compared with the room temperature thermal noise. Therefore, it is further amplified at higher temperature stages, in an embodiment (see also FIG. 2).

Figure 2:
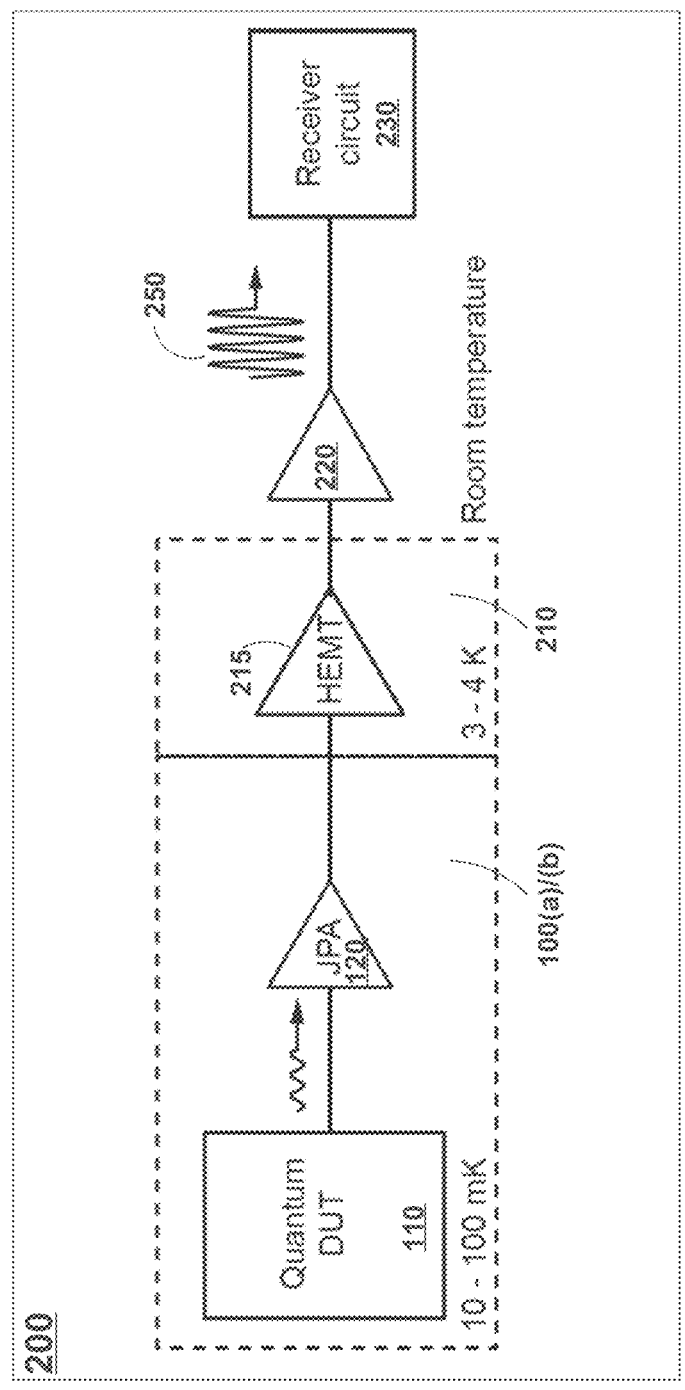
FIG. 2 is a block diagram that depicts a microwave amplification system with a Josephson parametric amplifier (JPA) at millikelvin temperatures for quantum-based signal, with further amplification at 3-4K, and at room temperature, in an embodiment.

FIG. 2 is a block diagram that depicts a system with a Josephson parametric amplifier (JPA) at millikelvin temperatures for quantum-based signal, with further amplification at 3-4K, and at room temperature, in an embodiment. In such an embodiment, JPA generated signal 155 of system 100(a)/(b), as an example, is further amplified typically once at 3-4 K (210) by cryogenic HEMT amplifier 215 of system 200, and once again at room temperature by amplifier 220 to generate amplified signal 250. Signal 250 is detected by receiver circuit 230, typically in either homodyne or heterodyne detection, as an example.

Although system 200 may amplify the quantum-based signals, system 200 suffers from a limited dynamic range. This is due to JPA 120 (and JPAs in general) having limited dynamic range, i.e., due to having very low input saturation power. For example, JPA 120 may have a maximum input power of about −100 dBm (0.1 picowatts). Using such JPA 120 would limit system 200 to reading simultaneously only theoretically twenty quantum-bits (qubits), and however, in practice, further reduced to five quantum-bits.

Another approach for amplifying microwave signals is a maser ("microwave amplification by stimulated emission of radiation"), with spins in solids. FIG. 3(a)/(b)/(c) are diagrams that describe an example of a maser operation, in one or more embodiments. In FIG. 3(a), a maser operation is depicted that includes a quantum mechanical energy level system in its equilibrium, in an embodiment. The lower energy level and upper energy level are the ground, |g⟩ (310a), and the excited, |e⟩ (320b), states, respectively, which are separated by the energy of $\hbar\omega$. Here, $\hbar\omega\gg k_B T$ is assumed.

In FIG. 3(b), the diagram depicts a population inversion, where the upper level 320b is more populated than the lower level 310b. When a population of a quantum mechanical energy level is caused to be inverted (in FIG. 3(b)), the amplification occurs due to stimulated emission (as depicted in FIG. 3(c)). Accordingly, FIG. 3(c) depicts an amplification of signal 350 by stimulated emission of radiation 355, in an embodiment.

The challenge of the maser-based approach is how to excite the quantum mechanical system into a situation, in which the population is inverted. To address this challenge, techniques described herein utilize a system which has multiple energy levels, at least having three levels.

FIG. 4(a)/(b) are diagrams that depict an example operation of a three-level maser with a pump signal, in an embodiment. In such an embodiment, the inversion is achieved by utilizing another level |f⟩ (430a and 430b). In FIG. 4(a), strong pump signal 450 with energy of $\hbar\omega$' excites the population from the ground state |g⟩, 410a, to the third level (|f⟩), 430a/b, which is above the first excited state |e⟩, 420a/b, in the energy level. Subsequently, the population goes, from the state |f⟩, 430b, to the second level |e⟩, 420b, resulting in a creation of population inversion at state 420b, which are separated from ground state |g⟩, 410b, by an energy of $\hbar\omega$.

In such an embodiment, it is assumed that the probability of the transition between |e⟩, 420b, and |f⟩, 430b, states are high. Thus, the population in |f⟩-state, 430a is going to immediately relax into |e⟩, 420b. As a result of the relaxation, the population for the transition between |g⟩, 410b, and |e⟩, 420b, states will be able to be inverted by "pumping" the transition between $|g\rangle$, 410a, to $|f\rangle$, 430a states. This three-level maser scheme may be realized in paramagnetic materials, which possess multiple energy levels, such as ruby (chromium-doped sapphire).

The noise performance of the maser amplifier may reach the quantum mechanical lower limit $$T_{N0} = \frac{\hbar\omega}{2k_B}$$

provided that it is operated at extremely low temperature, such that $$T \ll \frac{\hbar\omega}{k_B},$$

and the spin relaxation rate is lower than the pumping rate. The former is nowadays always the case in the quantum information and technology applications at microwave frequencies in a dilution refrigerator. The latter is also the case at millikelvin temperatures, where the spin-lattice relaxation path, which is the dominant relaxation mechanism at a higher temperature, is frozen out, resulting in extremely slow relaxation (typically ~min, sometimes even ~hour).

Impurity Crystal-Based Maser Overview

Figure 5A:
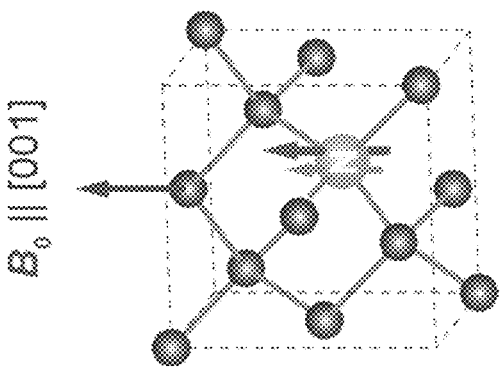
FIG. 5A is a diagram that depicts a crystallographic schematic of a "P1 center," a nitrogen impurity in a diamond, in an embodiment.

In an embodiment, a maser system is operated using a crystal with impurities. FIG. 5(a) is a diagram that depicts a crystallographic schematic of "P1 center in diamond", a nitrogen impurity in a diamond, in an embodiment. P1 center is an example of one of the stable impurity centers in diamond.

In an embodiment, due to placing diamond crystals at millikelvin temperature, the impurity generates spins that are fully polarized in the quantum ground state. The relaxation process for such a paramagnetic material is a spin-lattice relaxation, which may add significant noise for the maser amplification at high temperatures. However, the relaxation process at millikelvin temperatures are extremely long, sometimes reaching hours. Therefore, it produces negligible noise.

In an embodiment, the quantum system uses a pumping microwave frequency, which has a lower frequency than the signal frequency rather than using a higher frequency than that of the signal. Despite using a lower pumping frequency than the signal frequency, the system continues to produce a population inversion.

One technique to achieve inversion with lower pumping frequency than that of the signal is to use P1 centers in diamond (FIG. 5(a)). Although the approaches herein describe using P1 centers for impurity and diamond as a paramagnetic material, the techniques described herein are not limited to P1 centers and/or diamonds. Other impurities and paramagnetic materials may be used in the techniques described herein to achieve similar results.

In an embodiment, an impurity structure introduces multiple energy levels for stimulated emission. The energy levels may be based on the permutation pairs of the electron spin and nuclear spin of a P1 center. If an impurity possesses possible three nuclear spins and two electron spins, then a total of six different energy levels are introduced to the system for stimulating emission.

Figure 5B:
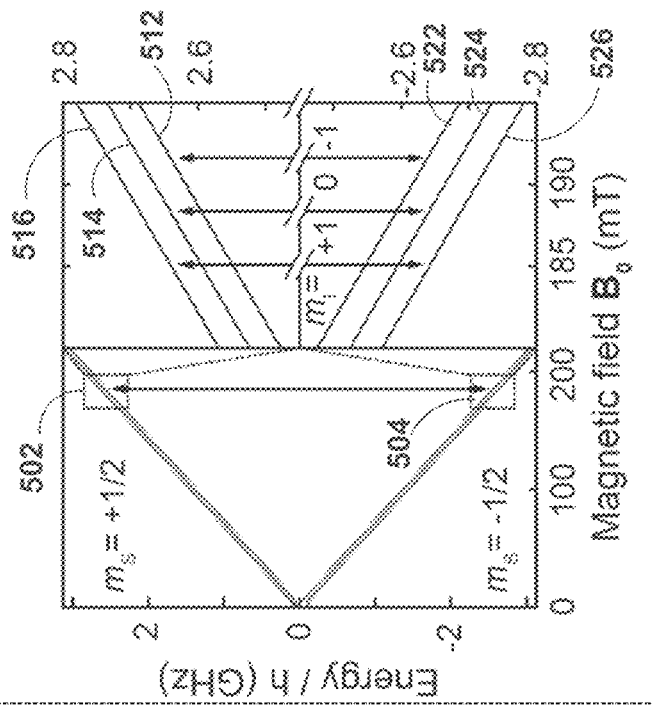
FIG. 5B is an energy level diagram that depicts the energy levels of each state versus constant magnetic field $B_0$ that is parallel to the crystallographic [001] axis, in an embodiment.

FIG. 5(b) is an energy level diagram that depicts the energy level of each state versus constant magnetic field $B_0$ that is parallel to the crystallographic [001] axis, in an embodiment. The energy levels are generated due to hyperfine interaction between the electron spin and the nuclear spin. In such an embodiment, the P1 center of FIG. 5(a) possesses an electron spin of one half ($m_s=\pm\frac{1}{2}$) and nuclear spin of one ($m_I=-1, 0, +1$), which split the electron spin resonance transition ($-\frac{1}{2} \leftrightarrows +\frac{1}{2}$) into three, each of which corresponds to one of the nuclear spin states, as depicted in FIG. 5(b). Thus, in total, there are six energy levels. In FIG. 5(b) the three states corresponding to ($ms=+\frac{1}{2}$) are labeled as 512, 514, 516, and the other three states corresponding to $ms=-\frac{1}{2}$ are labeled 522, 524, 526. In the right hand panel of FIG. 5(b), a zoom of 502 and 504 of the left hand panel of FIG. 5(b) is depicted.

In the P1 center example, the frequencies of the three transitions (between 526 and 516, 524 and 514, and 522 and 512, respectively) are equally spaced, as depicted by the distance between lines 516 and 514, between lines 512 and 514, between lines 522 and 524, and between lines 524 and 526 in FIG. 5(b). Thus, the energy required to flip two spins in the central transition (of $m_I=0$, between 524 and 514) is the same as the one to flip each one spin in the transitions on both sides (between 526 and 516, and between 522 and 512) simultaneously. This process is referred to herein as "cross-relaxation," an example of which is depicted in FIG. 6(a).

Figure 6B:
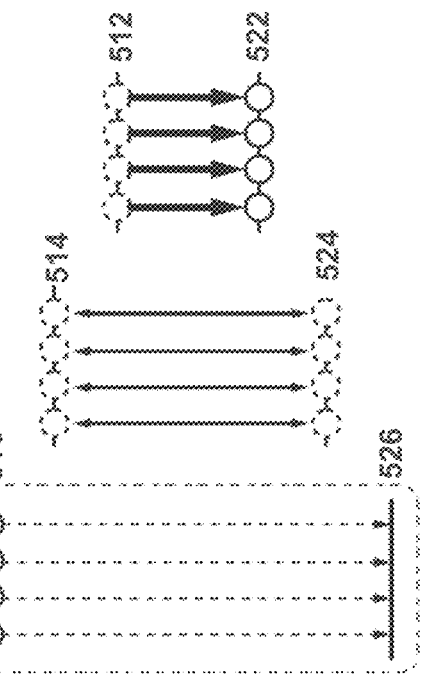
FIG. 6A and FIG. 6B are diagrams that depict a process of inversion through cross-relaxation of a diamond maser for transition frequencies at a fixed magnetic field of a P1 center for each nuclear spin, in one or more embodiments.
Figure 6A:
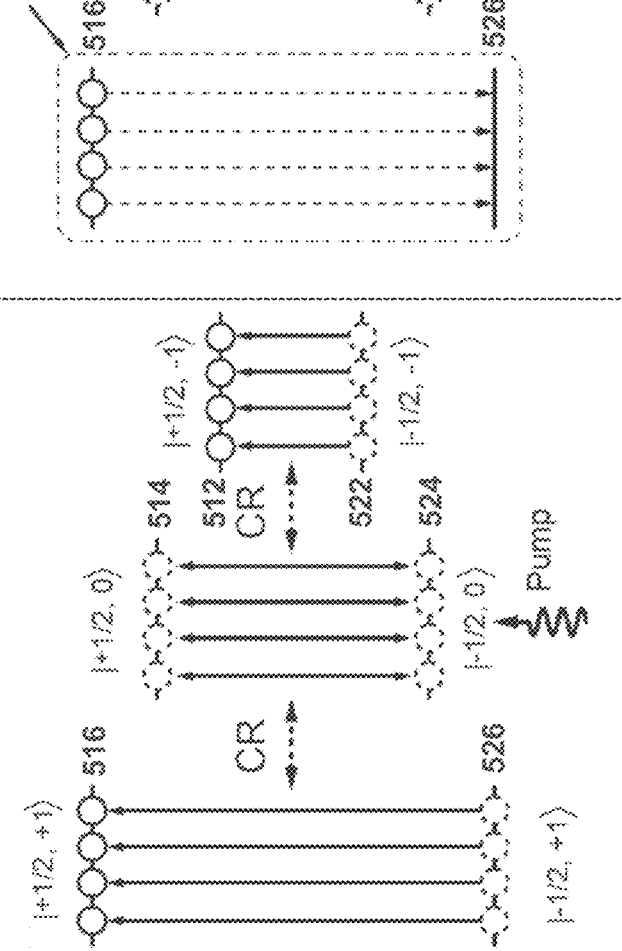

FIGS. 6(a)/(b) are diagrams that depict a process of inversion through cross-relaxation of a diamond maser under a fixed magnetic field, in an embodiment. The population inversion may be realized by pumping the central transition (between 524 and 514 of FIG. 5(b).) The microwave pump transfers the population from the state 524 to the state 514. The cross-relaxation process leads to population from the state 514 returning back to 524 and at the same time the populations from the states 526 and 522 transferring to the upper states 516 and 512, respectively. In addition, the population from each of the three upper states, 512, 514, 516 relaxes to the corresponding lower state 522, 524, 526 due to the spin-lattice relaxation.

In an embodiment, an asymmetry of the relaxation rate exists between the two transitions on each side (between 526 and 516, and between 522 and 512 of FIG. 6) is assumed to exist. Moreover, the time required for the cross-relaxation is assumed to be shorter than the time for the spin-lattice relaxation of each transition. And, experimentally, it has been verified that both are indeed satisfied.

In such a situation, population inversion would be established in either the upper level 512 or 516. For example, if the relaxation rate of the transition on the right-hand side (from 512 to 526) is much greater than that of the left hand side (from 516 to 526), the population in the left transition will keep pumped in the upper state 516, as depicted in FIG. 6(b).

The above-described relaxation conditions occur for P1 centers in diamond in the presence of another type of defect centers, such as a nitrogen-vacancy (NV) center. NV centers have electronic spin 1. In a static magnetic field above 100 mT, the resonant frequencies of the NV centers are close to that of P1 centers. For techniques using the diamond crystal, NV centers are distributed over the same volume in a density of about 2 ppm. P1 centers and NV centers may exchange energy via spin flip-flop transitions and other higher-order cross-relaxation processes. The interaction between the spins of P1 and N-V centers leads to an accelerated relaxation of the P1 centers in the state 512 and to the enhanced population of the state 516, and eventually to the population inversion at the transition between the states 526 and 516.

System Overview

Figure 7:
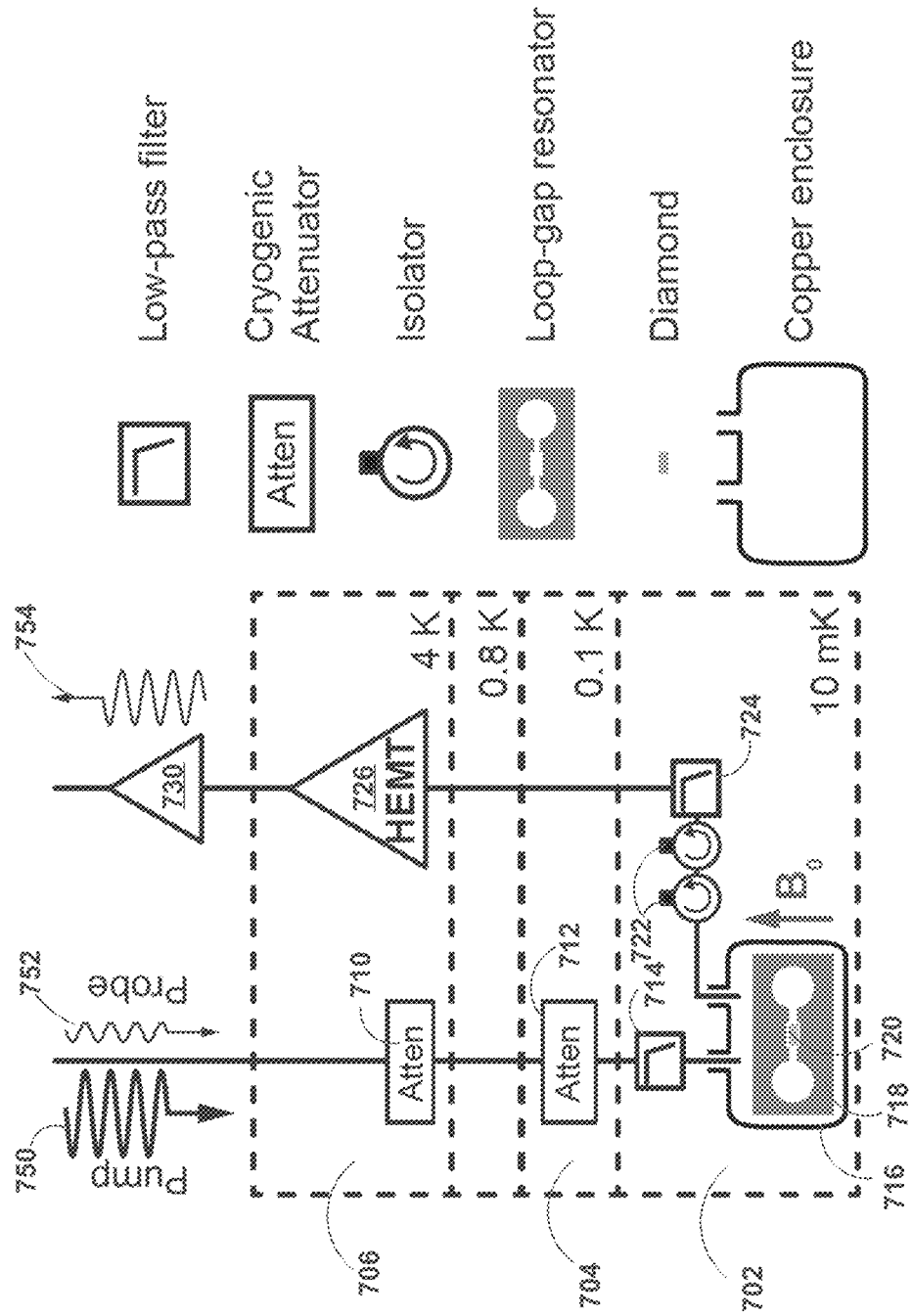
FIG. 7 is a block diagram that depicts quantum system 700 for microwave amplification, in an embodiment.
Figure 8:
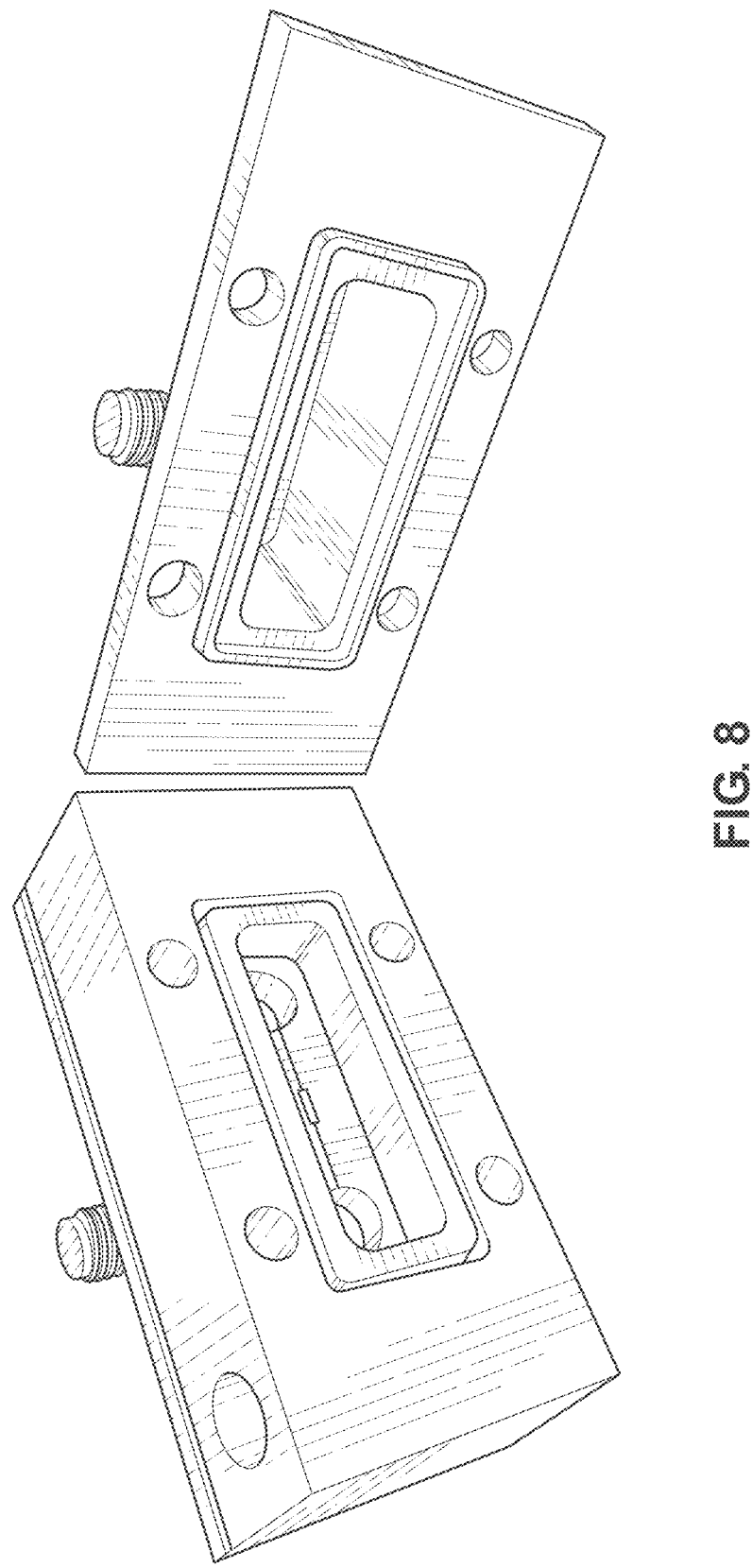
FIG. 8 is a photo that depicts a microwave resonator, in an embodiment.

FIG. 7 is a block diagram that depicts microwave quantum amplification system 700 for microwave amplification, in an embodiment. Microwave quantum amplification system 700 includes dilution refrigerator 702 with a base temperature of about 10 mK. Diamond crystal 720 is placed in loop-gap microwave resonator 718 (an example of which is depicted in FIG. 8) within copper enclosure 716. Loop-gap microwave resonator 718 is thermally anchored to the 10 mK plate of dilution refrigerator 702, in an embodiment. Constant magnetic field $B_0$ is generated by a superconducting coil and applied to diamond 720 along its crystallographic axis.

In an embodiment, the transmission spectra are measured by transmitting probing microwave input signal 752 to resonator 718 through coaxial cables with a series of attenuations 710 and 712. Attenuators 710 and 712 suppress thermal noise coming from room temperature through the microwave coaxial cables at temperature stages of 3 or 4 K and 100 mK, respectively.

In an embodiment, the microwave signals originate from microwave resonator 718 pass through (series of) cryogenic isolators 722 and a low pass filter 724, which filters out the high band noise and any remnants of pump signal 750. The signal may then be further amplified by high electron mobility transistor (HEMT) cryogenic amplifier 726 at 3-4 K and may be further followed by another amplifier, amplifier 730, at the room temperature. Cryogenic isolators 722 serve to prevent noise signals generated by the HEMT amplifier from entering back into resonator 718, in an embodiment.

To perform the maser-based amplification, $B_0$ magnetic field is tuned to such magnitude that the central spin transition ("$m_I=0$", between 524 and 514 of FIG. 5 and also see FIG. 6) is matched to the frequency of microwave resonator 718, in an embodiment. An example magnetic field $B_0$ of about 189 millitesla is applied for the results in FIG. 9, but this value of magnetic field $B_0$ may change depending on the operating frequency of resonator 718. Pumping signal 750 strongly drives the central spin transition of P1 centers (between 524 and 514), for example, with a power of a few microwatts at the resonator frequency to resonator 718 to cause population inversion of the impurity as described for FIGS. 5 and 6.

Figure 9:
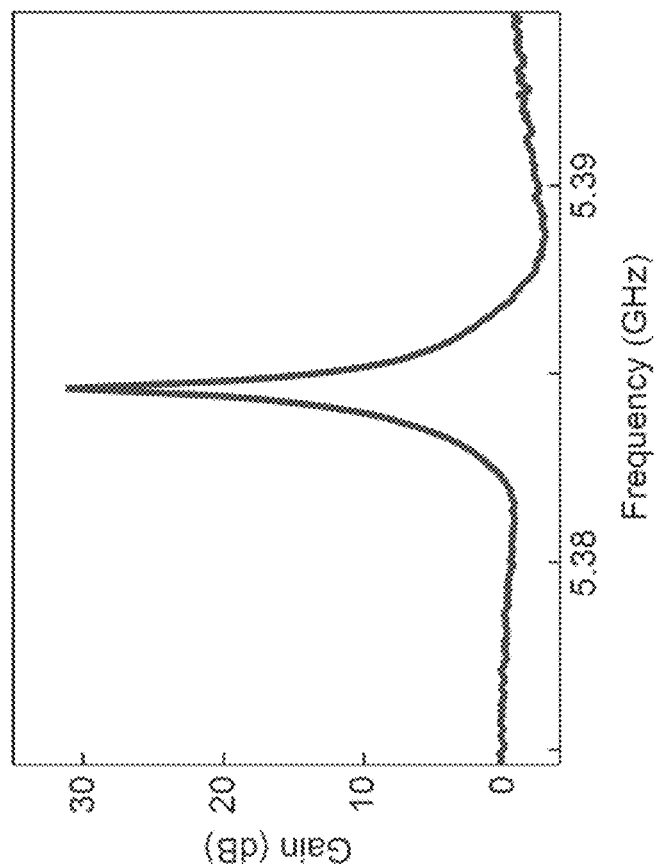
FIG. 9 is a diagram that depicts an example gain of microwave quantum amplification system 700, in an embodiment.

In an embodiment, to determine the maser amplifier's gain, the magnetic field, $B_0$, is changed to about 186 milli-Tesla, where the low field transition ($m_I=+1$, between 516 and 526 of FIG. 5) frequency is matched to the frequency, $\omega_r$, of resonator 718. (Changing the constant magnetic field $B_0$ is not necessary though, as described further below.) Amplified signal 754 is measured at room temperature, as similarly described for FIGS. 2 and 7, by sending a weak probe microwave signal (~femtowatt) as input signal 752. FIG. 9 is a diagram that depicts an example gain of quantum system 700, in an embodiment. The gain is measured to be more than 30 dB, as depicted in FIG. 9, and the example bandwidth as narrow as ~100 kHz.

Figure 10:
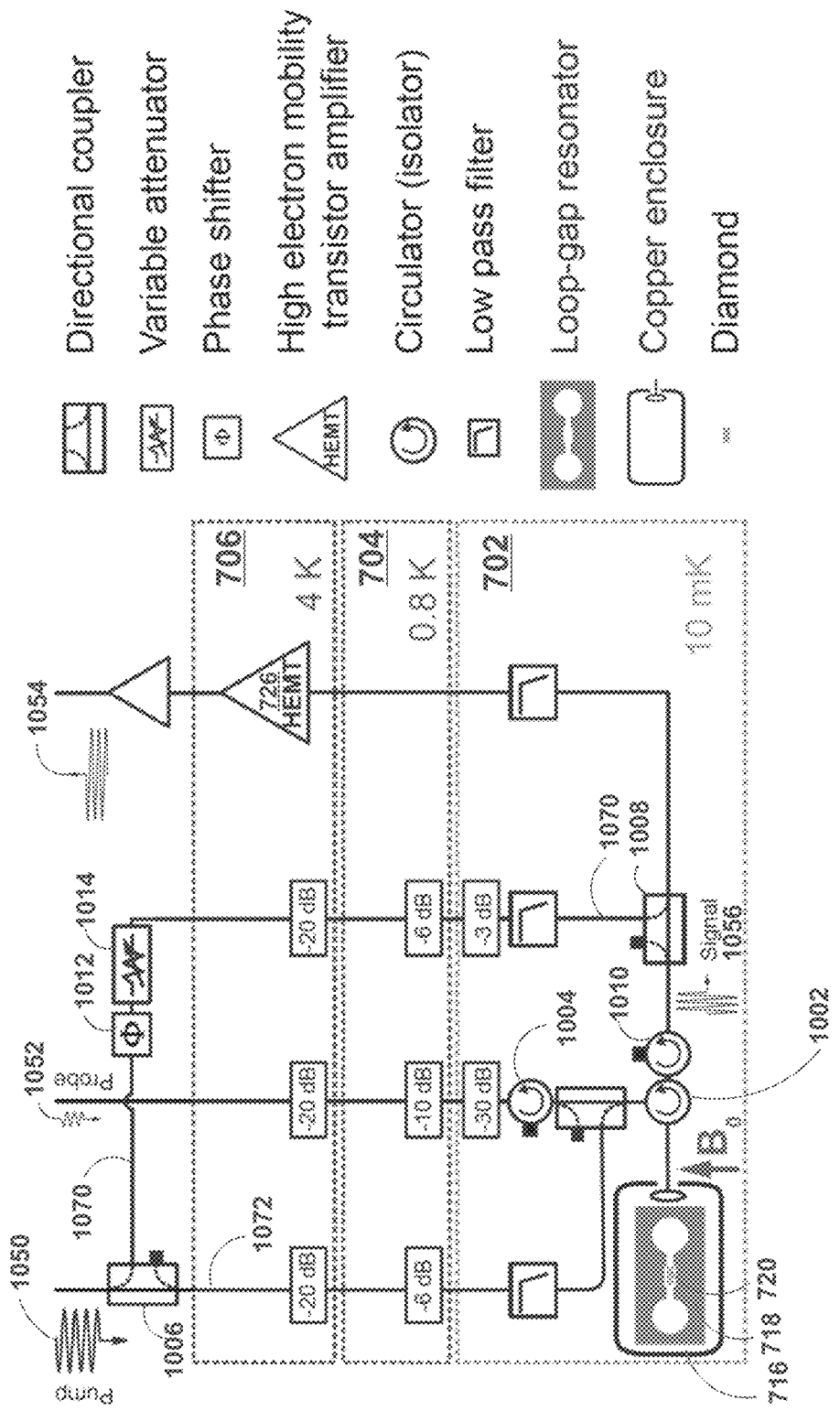
FIG. 10 is a block diagram that depicts quantum system 1000 for microwave amplification, in an embodiment.

FIG. 10 is a block diagram that depicts quantum system 1000 for microwave amplification, as an alternative embodiment. Unlike quantum system 700 that uses microwave transmission, microwave reflection coefficient is measured in system 1000 (see also FIG. 1, system 100(b)) by putting circulator 1002 and isolator 1004 before microwave resonator 718 so that the outgoing signals, such as signal 1056, are routed to cold HEMT amplifier 726 and the following measurement chain. Although the alternative embodiment describes the reflection-based measurement, the embodiment may be modified for the transmission measurement.

In system 1000, cancellation line 1070 is also installed to suppress any unwanted effects by the strong pump signal 1050, which may distort the measurement. To this end, the microwave signal for the pump 1050 is split into two by directional coupler 1006; one is used for pump line 1072, and the other is for cancellation line 1070. The split pump signals are separately sent to the inside of the dilution refrigerator through each temperature stage 706, 704, and 702. The cancellation signal is combined by directional coupler 1008 back with the reflected pump signal out of resonator 718's after circulator 1002 and isolator 1010 at 10 mK in refrigerator 702. The phase and amplitude of the cancellation signal are tuned to have 180 degrees shifted and the same amplitude as of the reflected pump signal 1050 by phase shifter 1012 and variable attenuator 1014, respectively, so that the strong pump signal 1050 reflected from the resonator 718 coming into directional coupler 1008 is canceled out.

In an embodiment, $B_0$ is fixed such that the high-energy spin transition ($m_I=+1$, between 516 and 526) matches the frequency of microwave resonator 718 ($\omega_r=6.385$ GHz in this example). The spins are pumped by sending strong microwave signal 1050 with a power of a few microwatts, as an example, at the frequency of $\omega_p=6.293$ GHz, which is off-resonant with resonator 718 but resonant with the central spin transition ($m_I=0$, between 514 and 524), in this example.

System 1000 may be probed by sending weak microwave signal 1052 (~<-100 dBm) across $\omega_r$ and measuring the reflected signal at the same frequency. Resulting signal 1054 of system 1000 is analyzed by a vector network analyzer (VNA).

Figure 11:
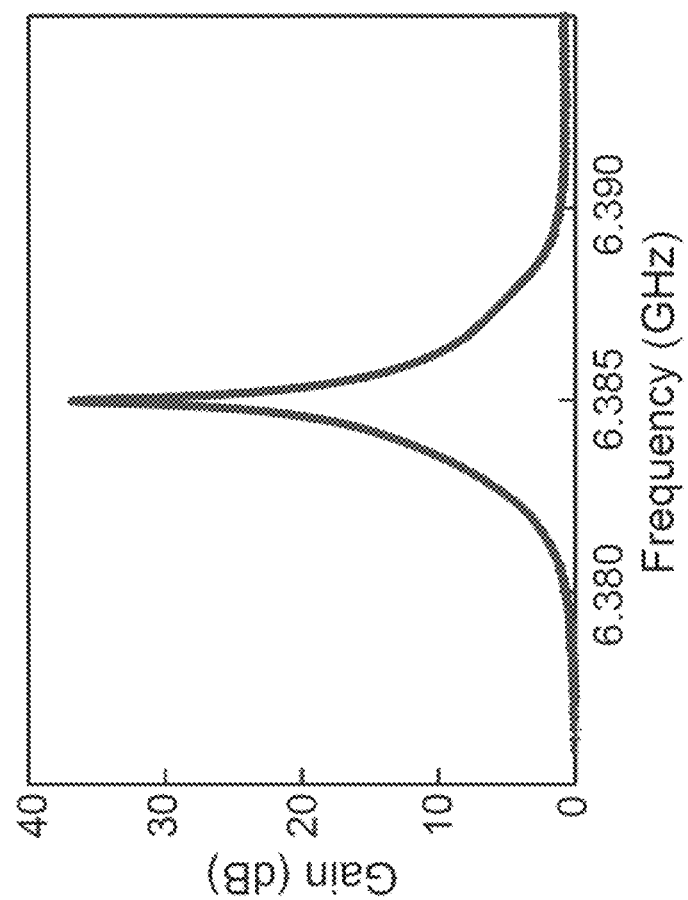
FIG. 11 is a diagram that depicts the gain spectrum of resulting signal of microwave quantum amplification system 1000, in an embodiment.

FIG. 11 is a diagram that depicts the gain spectrum of resulting signal 1052 of system 1000, in an embodiment. In such an embodiment, the maximum gain was measured to be about 37 dB with a bandwidth of about 100 kHz. The gain profile may be tunable over a wide frequency range by adjusting the value of the resonator frequency $\omega_r$ of 718 and the static magnetic field $B_0$.

Functional Overview

Figure 12:
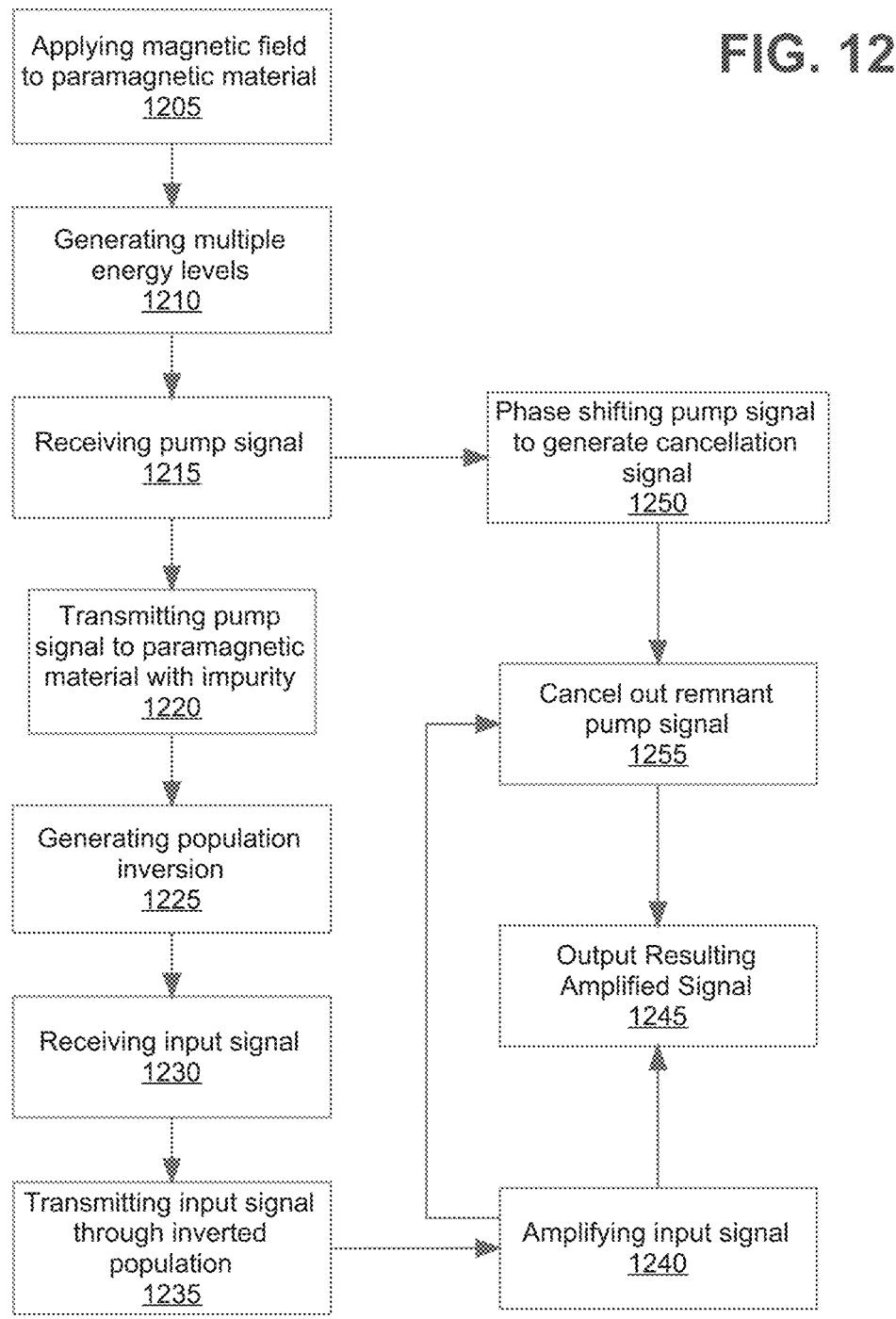
FIG. 12 is a flow diagram that depicts a process of microwave amplification in a paramagnetic material with an impurity, in an embodiment.

FIG. 12 is a flow diagram that depicts a process of quantum microwave amplification in a paramagnetic material with an impurity, in an embodiment. At step 1205, a magnetic field is applied to the paramagnetic material along the crystallographic axis. The application of a magnetic field generates, at step 1210, multiple possible energy levels for the population corresponding to nuclear and electron spins. Each combination of nuclear and electron spins corresponds to a unique energy level. In an embodiment, possible energy levels for a particular electron spin are equally spaced.

At step 1215, receiving a pump signal and transmitting the pump signal, at step 1220, to the paramagnetic material with the impurity. The pumping signal provides the additional energy that transfer the population to an initial excited state that corresponds to a different electron spin state than the initial ground state of the impurity. At step 1225, due to the cross-relaxation described in FIG. 6B, or due to spin-lattice relaxations, the paramagnetic spin system is transferred to the excited states, which may correspond to a different nuclear spin state or a different electron spin state. The energy level of the new excited state is determined by the static magnetic field $B_0$ applied and the strength of the pumping signal (power/frequency, see FIG. 5), in an embodiment.

At step 1230, an input microwave signal to amplify arrives at the system. The signal is then routed through the paramagnetic material of the maser amplifier, at step 1235, and is, thereby, amplified by the maser amplifier, at step 1240, as described in FIGS. 3 and 4 embodiments. The resulting signal may be transmitted as an output of the maser amplifier, at step 1245, and/or further amplified by non-cryogenic environment amplifiers such as HEMT at 4K (or similar temperatures) and additional amplifiers at room temperatures.

In an embodiment, one or more low pass filters and attenuators may be used to reduce the thermal noise. Alternatively or additionally, a cancellation signal may be generated, at step 1250, by phase-shifting (180 degrees) and tuning the amplitude by variable attenuators to the same as of the pump signal coming out of the maser amplifier. The cancelation signal is used to cancel out the remnants of the pump signal in the amplified input signal, at step 1255. The resulting output signal, at step 1245, has less noise.

Quantum System Noise Performance

The noise temperature of the invented maser amplifier is characterized using alternative techniques. Using the first technique, magnetic field $B_0$ is fixed such that the central P1 center spin transition ($m_I=0$, between 514 and 524 see FIGS. 5 and 6) matches to the frequency of microwave resonator 718, which is about 189 milli-Tesla, for example (although this value may change in each experiment depending on the resonator frequency). The central P1 center spin transition may be pumped by sending a strong microwave signal with a power of a few microwatt at the resonator frequency ($\omega_r=5.384$ GHz), as an example. Magnetic field $B_0$ is then changed to about 186 millitesla (likewise, this value may also change in each experiment depending on the resonator frequency), where the low field transition ($m_I=+1$) frequency matched to the resonator frequency $\omega_r$. A spectrum analyzer may be used to measure the noise power spectral density of the system (see also next paragraph).

Using a different technique of noise temperature characterization, $B_0$ is fixed such that the high-energy spin transition ($m_I=+1$, 516 and 526) matches the frequency of the microwave resonator, and the central spin transition ($m_I=0$, 514 and 524) is pumped by sending a strong microwave signal with a power of a few micro-Watts, as an example. Instead of sending a probe microwave signal into the resonator, the noise power spectrum at the resonator frequency is measured using a spectrum analyzer, in an embodiment. The resulting total noise temperature $T_N+T_{bath}$ is estimated to be about 0.6 K. This suggests that the maser amplifier described herein has a noise temperature of about 0.4 K, which is very close to $$T_{N0} \approx \frac{\hbar \omega}{2k_B} = 0.15 \text{ K}$$

(for 6 GHz microwave), assuming that the thermal photon noise $T_{bath}$ inside the resonator is as low as the vacuum noise, which is equal to $T_{N0}$. The obtained noise temperature, which is slightly higher than the quantum limited, may attribute to the insufficient attenuation and filtering of systems 700 and 1000, which may have increased the thermal photon noise $T_{bath}$ to 0.3 K or more, resulting in increasing the total noise temperature.

The dynamic range of the maser amplifier may be evaluated. The power dependence of the gain is measured by changing the probe microwave signal power, in an embodiment. The saturation power is estimated at least to be about 0.1 nanowatts, which is more than three orders of magnitude higher than that of the value of 0.1 picowatts of the state-of-the-art JPAs. It was confirmed that this saturation is attributed to the saturation of the cryogenic HEMT amplifier. This implies that the actual saturation power of the maser amplifier invented is much higher.

Quantum Information Input-Based System Overview

Figure 13:
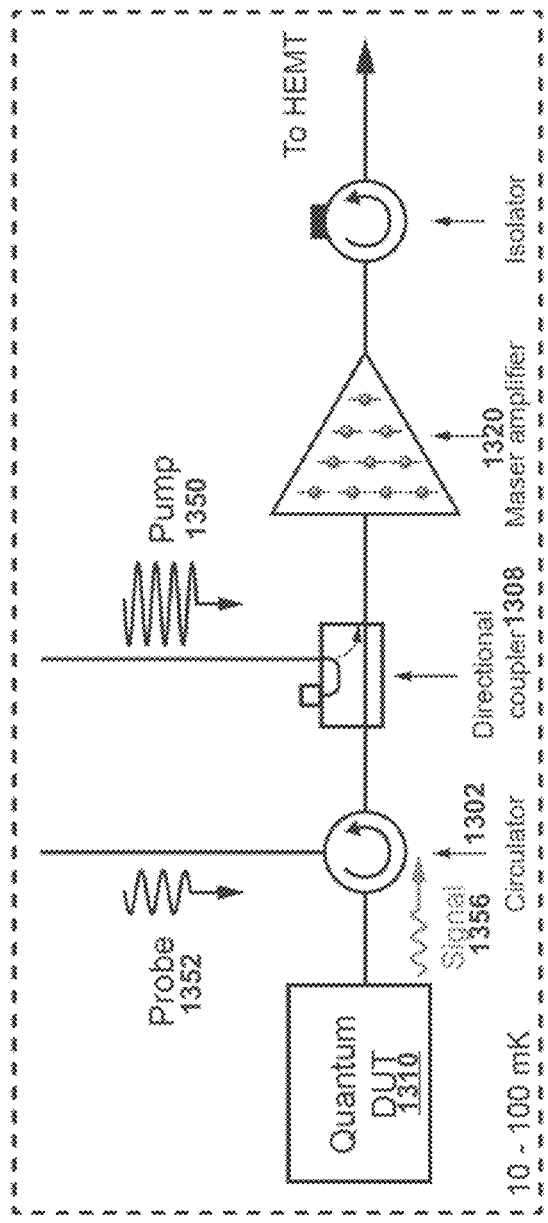
FIG. 13 is a block diagram that depicts an example of a maser amplifier application to microwave quantum information and technology, in an embodiment.

FIG. 13 is a block diagram that depicts an example of a maser amplifier application to microwave quantum information science and technology, in an embodiment. In FIG. 13, the microwave signal coming out of quantum DUT 1310, which contains quantum information of 1310, such as a state of qubit(s) (referenced as signal 1356), is sent to maser amplifier 1320 through circulator 1302. Accordingly, signal 1356 gets amplified through maser amplifier 1320. This amplified signal is further amplified by a HEMT amplifier at a higher temperature stage, if necessary, followed by another amplifier at room temperature (examples of which are depicted in FIGS. 2, 7, and 10) and is measured by a receiver circuit, in the same way as in FIG. 2.

Pump microwave signal 1350 may be separately fed to maser amplifier 1320 through another dedicated microwave line, passing through coupler or combiner, such as 1308. This strong pump signal may be canceled using similar techniques as discussed above in FIG. 8. Alternatively or additionally, the remnants of strong pump signal 1350 may be dissipated at a higher temperature stage. For example, the remnant of strong pump signal 1350 may be routed to another microwave line by a microwave diplexer, which is placed between the coldest temperature stage (10-100 mK) and HEMT at 3-4K.

The bandwidth of a microwave amplifier may be described in terms of gain-bandwidth product $$G^{\frac{1}{2}} \cdot B,$$

where G is the power gain, and B is the bandwidth of the amplifier. For example, the example maser amplifier demonstrated in this invention may have a gain-bandwidth of about 5-15 MHz. Example JPAs (Josephson parametric amplifier) have a gain-bandwidth range from 10 MHz to more than 10 GHz.

Travelling-Wave Amplifier

Figure 14:
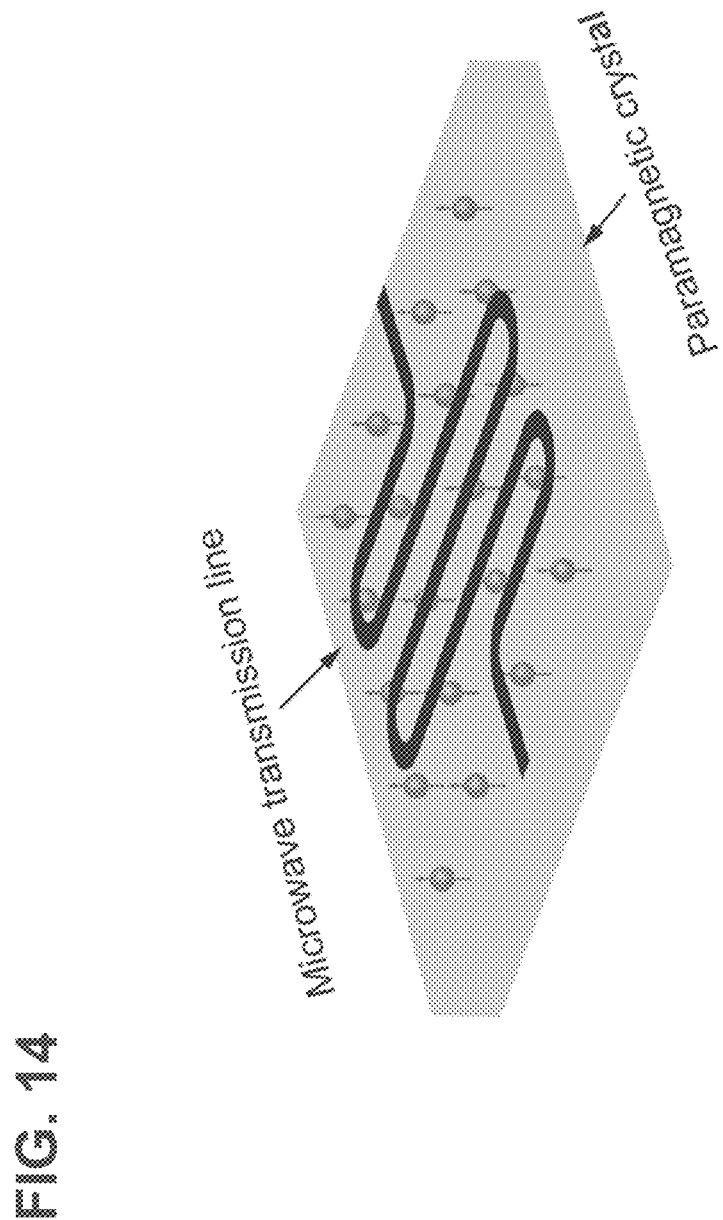
FIG. 14 is a diagram that depicts a traveling-wave maser amplifier, in an embodiment.

In an embodiment, a maser amplifier comprises of a chain of maser amplifiers to improve the gain-bandwidth. Instead of putting a paramagnetic crystal in a microwave resonator, as depicted in FIG. 7, a transmission line (waveguide) is patterned directly on top of the paramagnetic crystal. The transmission line may be of various types, e.g., stripline or coplanar waveguide. Such an arrangement yields a "traveling-wave" maser amplifier. FIG. 14 is a schematic that depicts a traveling-wave maser amplifier, in an embodiment.

The traveling-wave maser may include a transmission line on top of a ruby crystal. Such devices may have a gain-bandwidth product of about 500 MHz or more.

In an embodiment, the microwave transmission line is a lossless superconducting material, such as Nb, NbTi, TiN, or NbTiN, which suppresses ohmic losses inside the amplifier, resulting in a further improvement of the gain. Moreover, operating, such a traveling-wave maser amplifier, at a millikelvin temperature enhances the polarization of spins in the lowest energy level by more than one order of magnitude. Such an environment increases the effective number of spins which contributes to the amplification process (as depicted in FIG. 3 and FIG. 4), resulting in even further improvement of the gain.

In an embodiment, the magnetic field gradient may be applied to the paramagnetic maser crystal to further increase the bandwidth of a traveling-guide maser amplifier. Such a gradient makes the electron spin resonance transition frequencies inhomogeneous over the crystal, i.e., increase the linewidth of the transition, therefore increasing the bandwidth of the maser amplifier can be enhanced, which is beneficial to the applications to quantum technology, such as the example described for FIG. 13.

What is claimed is:

1. A microwave amplification system comprising:
    a microwave amplifier comprising a paramagnetic material that includes an impurity, the impurity having a plurality of energy levels;
    an input to receive a pumping signal;
    an input to receive an input signal to be amplified by the microwave amplifier, wherein the input signal has lower power than the pumping signal;
    wherein the pumping signal causes, at a millikelvin temperature range, a particular population inversion to a particular excited state corresponding to a particular energy level of the plurality of energy levels;
    wherein the particular population inversion of the particular excited state corresponding to the particular energy level of the plurality of energy levels causes amplification of the input signal, thereby generating an amplified signal.

2. The system of claim 1, wherein the millikelvin temperature range is from 10 millikelvin to 100 millikelvin.

3. The system of claim 1, wherein the pumping signal is at a microwave frequency lower than a frequency of the input signal.

4. The system of claim 1,
    wherein the pumping signal causes, at the millikelvin temperature range, an initial population inversion from a ground state to an initial excited state corresponding to an initial energy level of the plurality of energy levels;
    wherein the particular population inversion is caused by cross-relaxation of the initial population inversion to the particular excited state corresponding to the particular energy level;
    wherein relaxation of the particular population inversion corresponding of the particular excited state corresponding to the particular energy level of the plurality of energy levels causes amplification of the input signal, thereby generating the amplified signal.

5. The system of claim 1, wherein each of the plurality of energy levels corresponds to a respective unique spin state of the impurity including one or more of a nuclear spin state or an electron spin state.

6. The system of claim 1, wherein the paramagnetic material comprising the impurity, is placed in a microwave resonator that is coupled to a dilution refrigerator.

7. The system of claim 1, wherein the paramagnetic material is a diamond crystal, and the impurity is a nitrogen impurity within the diamond crystal.

8. The system of claim 1, wherein the paramagnetic material is a ruby crystal, and the impurity is a chromium impurity within the ruby crystal.

9. The system of claim 1, wherein a magnetic field is applied to the paramagnetic material, thereby generating excited states for impurity population of the impurity.

10. The system of claim 1, further comprising:
    a phase shifter, the phase shifter receiving the pump signal and generating a phase-shifted signal, cancellation signal, of the pump signal;
    a directional coupler to merge the cancellation signal with the amplified signal to cancel at least a portion of the pump signal for the amplified signal.

11. The system of claim 1, wherein the microwave amplifier comprises a transmission line coupled to the input to receive the input signal, the transmission line routing the input signal through a plurality of impurities of the paramagnetic material that includes the impurity.

12. The system of claim 1, wherein the system is a travelling-wave maser amplifier.

13. The system of claim 12, wherein the paramagnetic material comprises a transmission line.

14. A method comprising:
    receiving, at a first input of a microwave amplifier, a pumping signal;
    receiving, at a second input of the microwave amplifier, an input signal to be amplified, wherein the input signal has lower power than the pumping signal;
    transmitting the pumping signal to a paramagnetic material of the microwave amplifier to cause, at a millikelvin temperature range, a particular population inversion to a particular excited state corresponding to a particular energy level of a plurality of energy levels;
    wherein the particular energy level is generated by existence of an impurity in the paramagnetic material;
    transmitting the input signal through the paramagnetic material of the microwave amplifier in the particular excited state corresponding to the particular energy level of the plurality of energy levels;
    based, at least in part, on transmitting the input signal through the paramagnetic material in the particular excited state, amplifying the input signal based, at least in part, on the particular energy level, thereby generating an amplified signal.

15. The method of claim 14, wherein the millikelvin temperature range is from 10 millikelvin to 100 millikelvin.

16. The method of claim 14, wherein the pumping signal is at a microwave frequency lower than a frequency of the input signal.

17. The method of claim 14, further comprising:
    the pumping signal causing, at the millikelvin temperature range, an initial population inversion from a ground state to an initial excited state corresponding to an initial energy level of the plurality of energy levels;
    wherein the particular population inversion is caused by cross-relaxation of the initial population inversion to the particular excited state corresponding to the particular energy level;
    wherein relaxation of the particular population inversion of the particular excited state corresponding to the particular energy level of the plurality of energy levels amplifies the input signal, thereby generating the amplified signal.

18. The method of claim 14, wherein each of the plurality of energy levels corresponds to a respective unique spin state of the impurity including one or more of: a nuclear spin state or an electron spin state.

19. The method of claim 14, further comprising applying a magnetic field to the paramagnetic material, thereby generating the plurality of energy levels.

20. The method of claim 14, further comprising:
the pump signal transforming an initial ground state of the impurity to an initial excited state, wherein the initial excited state is different from the initial ground state by at least the difference in an electron spin of the impurity.

* * * * *